United States Patent
Irkliy

(10) Patent No.: US 9,367,179 B2
(45) Date of Patent: Jun. 14, 2016

(54) CAPACITIVE VOLTAGE DIVIDER TOUCH SENSOR

(75) Inventor: Alex Irkliy, Portland, TN (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 518 days.

(21) Appl. No.: 12/127,558

(22) Filed: May 27, 2008

(65) Prior Publication Data
US 2009/0295409 A1 Dec. 3, 2009

(51) Int. Cl.
- G06F 3/044 (2006.01)
- G01D 5/24 (2006.01)
- H03K 17/955 (2006.01)
- G01R 27/26 (2006.01)

(52) U.S. Cl.
CPC *G06F 3/044* (2013.01); *G01D 5/24* (2013.01); *H03K 17/955* (2013.01); *G01R 27/2605* (2013.01); *H03K 2217/960725* (2013.01)

(58) Field of Classification Search
CPC .. G01R 27/2605; G01R 35/00; G01R 35/005; G01R 19/00; G06F 3/044; G06F 3/0416; Y10T 29/49002; H01L 21/82; H03K 2217/960725; H03M 1/468
USPC ........ 324/658, 678; 345/173, 174; 178/18.06, 178/19.03
See application file for complete search history.

(56) References Cited

U.S. PATENT DOCUMENTS

| | | | |
|---|---|---|---|
| 6,466,036 B1 * | 10/2002 | Philipp | 324/678 |
| 6,549,029 B1 | 4/2003 | Hsieh et al. | 324/750.01 |
| 7,301,350 B2 * | 11/2007 | Hargreaves et al. | 324/678 |
| 7,453,270 B2 * | 11/2008 | Hargreaves et al. | 324/686 |
| 7,521,941 B2 * | 4/2009 | Ely et al. | 324/678 |
| 7,902,842 B2 * | 3/2011 | Reynolds et al. | 324/678 |
| 8,552,994 B2 * | 10/2013 | Simmons | H03K 17/962 345/173 |
| 2004/0207412 A1 | 10/2004 | Kunikiyo et al. | 324/679 |
| 2006/0114247 A1 | 6/2006 | Brown | 345/204 |
| 2007/0075710 A1 | 4/2007 | Hargreaves et al. | 324/658 |
| 2008/0042660 A1 * | 2/2008 | Ely et al. | 324/678 |
| 2008/0116904 A1 * | 5/2008 | Reynolds et al. | 324/678 |
| 2008/0252303 A1 * | 10/2008 | Kato | H03K 17/955 324/661 |

FOREIGN PATENT DOCUMENTS

| | | | |
|---|---|---|---|
| CN | 1773442 A | 5/2006 | G02F 1/133 |
| JP | 2008064481 A | 3/2008 | G01R 27/26 |
| TW | 520442 B | 2/2003 | G01R 27/26 |
| WO | 2006133082 | 12/2006 | G01R 27/26 |
| WO | 2007140928 | 12/2007 | H03K 17/96 |

OTHER PUBLICATIONS

International Search Report and Written Opinion for Application No. PCT/US2009/044694 (18 pages), Oct. 13, 2010.

(Continued)

*Primary Examiner* — Arleen M Vazquez
*Assistant Examiner* — Alesa Allgood
(74) *Attorney, Agent, or Firm* — Slayden Grubert Beard PLLC

(57) ABSTRACT

A system for measuring capacitance has a measurement circuit with a first reference capacitor connected to a first node and to a second node. Each of the nodes is connected to a unit operable to apply a reference voltage or ground to one of the nodes. Each node has a first pad connected to the first node and a unit operable to measure voltage between the first node and second node.

18 Claims, 4 Drawing Sheets

(56) References Cited

OTHER PUBLICATIONS

Chinese Office Action, Application No. 200980107363.2, 8 pages, Jan. 22, 2013.
Chinese Office Action, Application No. 200980107363.2, 19 pages, Sep. 22, 2013.
Chinese Office Action, Application No. 200980107363.2, 17 pages, Mar. 25, 2014.
Taiwan Office Action, Application No. 098117328, 10 pages, Sep. 26, 2014.
Chinese Office Action, Application No. 200980107363.2, 18 pages, Dec. 8, 2014.
Chinese Office Action, Application No. 200980107363.2, 18 pages (Chinese w/ English translation), Jun. 30, 2015.
Korean Office Action, Application No. 1020107019350, 5 pages, Aug. 17, 2015.
Chinese Office Action, Application No. 200980107363.2, 7 pages, Jan. 27, 2016.
Korean Office Action, Application No. 2010-7019350, 4 pages, Mar. 25, 2016.

* cited by examiner

CAPACITIVE VOLTAGE DIVIDER TOUCH SENSOR

TECHNICAL FIELD OF THE INVENTION

This invention relates generally to the fields of touch sensors, proximity sensors and capacitance measurement, which have applications in a wide variety of fields, including automobiles, consumer electronics, and medical technology.

BACKGROUND

Touch sensors and proximity sensors have a myriad of uses. For example, they can function as buttons, sliders, or switches for user interface. These sensors can be found, for example, on kiosks, handheld electronic devices, and home appliances. They can be operated by pressing with a finger, touching a screen with a stylus, or even by the mere presence of a body as a proximity sensor.

The sensors themselves act as a capacitor. As the sensor is pressed, or as a body approaches it, the capacitance qualities of the sensor are changed. By determining the value of the capacitance or comparing it to known or previous quantities, information such as whether a contact was made or for how long contact was made can be determined.

Capacitive sensors are popular alternatives to mechanical buttons and switches, particularly, in microcontroller or microprocessor applications. Consequently, engineers seek to implement them more cheaply with fewer components. Systems and methods for easily measuring and detecting changes in capacitance, while simplifying designs and reducing the requisite number of components are desirable.

SUMMARY

According to an embodiment, a system for measuring capacitance may comprise a measurement circuit with a first reference capacitor connected to a first node and to a second node; each said nodes connected to a unit operable to apply a reference voltage or ground to one of said nodes; a first pad connected to the first node; and a unit operable to measure voltage between the first node and second node.

According to a further embodiment, the system may further comprise a second pad connected to the second node. According to a further embodiment, the units operable for applying reference voltages and ground to nodes may be comprised of a first switch connected to the node and to the reference voltage and a second switch connected to the node and to ground. According to a further embodiment, the system may further comprise a plurality of third nodes, fourth nodes, third pads, second reference capacitors, and units operable to measure voltage, where each said second reference capacitor may be connected to a third node and a fourth node; each said third and fourth node may be connected to a unit operable to apply a reference voltage or ground to the node; each said third pad may be connected to the third node; each said fourth pad may be connected to the fourth node; and a unit operable to measure voltage between the third node and the fourth node. According to a further embodiment, the units operable for applying reference voltages and ground to nodes may be embedded on a chip. According to a further embodiment, the units operable for applying reference voltages and ground to nodes can be enabled through configuration of said chip. According to a further embodiment, the units operable for measuring voltage between the first node and second node may be embedded on a chip. According to a further embodiment, the units operable for measuring voltage between the first node and second node may be enabled through configuration of said chip. According to a further embodiment, the units operable for measuring voltage between the first node and second node may be embodied by an analog-to-digital circuit. According to a further embodiment, the system may comprise a proximity sensor.

According to an embodiment, a method of measuring capacitance of a pad may comprise the steps of applying a voltage to the pad and to a reference capacitor, grounding the reference capacitor to create a circuit comprising the reference capacitor couple in series with the pad, and measuring the resulting voltage across the reference capacitor, said resulting voltage corresponding to the capacitance value of said first pad.

According to a further embodiment, the action of applying voltage across said pad may be automated by a microcontroller. According to a further embodiment, the action of applying voltage across said reference capacitor may be automated by a microcontroller. According to a further embodiment, the action of grounding said reference capacitor to create a circuit comprising the reference capacitor coupled in series with the pad may be automated by a microcontroller. According to a further embodiment, the measurement of capacitance may be accomplished by comparing the voltage of said reference capacitor against a baseline voltage. According to a further embodiment, the method may be applied to the measurement of capacitance of a plurality of pads.

According to an embodiment, a method of calculating the capacitance of a plurality of pads connected across a reference capacitor may comprise applying a voltage across a first pad, applying said voltage across a reference capacitor, grounding said reference capacitor to create a circuit comprising said reference capacitor coupled in series with said first pad, measuring the first resulting voltage across said reference capacitor, said resulting voltage corresponding to the capacitance value of said first pad, applying a voltage across a second pad, applying said voltage across said reference capacitor, grounding said reference capacitor to create a circuit comprising said reference capacitor coupled in series with said second pad, and capturing the second resulting voltage across said reference capacitor, said resulting voltage corresponding to the capacitance value of said second pad.

According to an embodiment, a method of determining the relative capacitance of two or more pads may comprise applying a voltage across a first pad, applying said voltage across a reference capacitor, grounding said reference capacitor to create a circuit comprising said reference capacitor coupled in series with said first pad, measuring the first resulting voltage across said reference capacitor, said resulting voltage corresponding to the capacitance value of said first pad, and for each second pad, applying a voltage across said second pad, applying said voltage across said reference capacitor, grounding said reference capacitor to create a circuit comprising said reference capacitor coupled in series with said second pad, capturing the second resulting voltage across said reference capacitor, said resulting voltage corresponding to the capacitance value of said second pad, and comparing the resulting voltages or capacitance calculations from the two or more pads.

BRIEF DESCRIPTION OF THE DRAWINGS

For a more complete understanding of the present invention and advantages thereof, reference is now made to the following description taken in conjunction with the accompanying drawings, in which.

DETAILED DESCRIPTION

Figure 1:
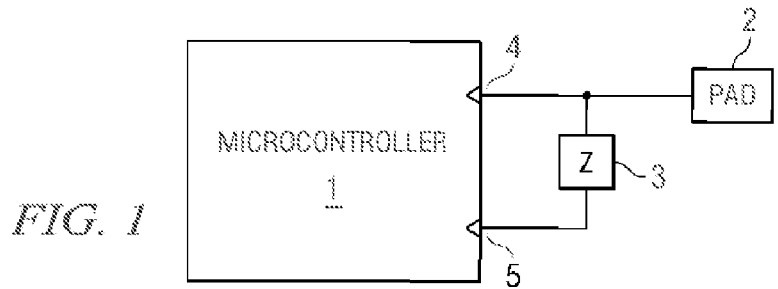
FIG. 1 illustrates an embodiment of single-pad sensor configuration using a microcontroller

FIG. 1 shows an embodiment using a microcontroller and a single pad. A programmable microcontroller 1 may have a plurality of input and output pins 4, 5. According to various embodiments, the microcontroller may be an ASIC, a programmable processor, a reprogrammable processor, or any other chip which circuitry can be embedded. The microcontroller may be a single unit or comprised of several separate microcontrollers. A pad 2 which here is implemented as a capacitive sensor is attached to a first pin 4. Pad 2 may be a touch sensor or proximity sensor of any variety. An impedance circuit with known capacitance 3 is connected between a first pin 4 and a second pin 5. According to one embodiment, the pins, 4, 5 are pins on a microcontroller. Other embodiments of the pins 4, 5 may take the form of a wire, lead, probe, line, or electrode.

In FIG. 1, the microcontroller 1 is operable to apply a reference voltage 9 to any of the pins 4, 5. The microcontroller 1 is further operable to apply ground to any of the pins 4, 5. The microcontroller 1 is further capable of measuring the voltage connected to any of the pins 4,5 or the voltage between pins 4, 5.

Figure 2:
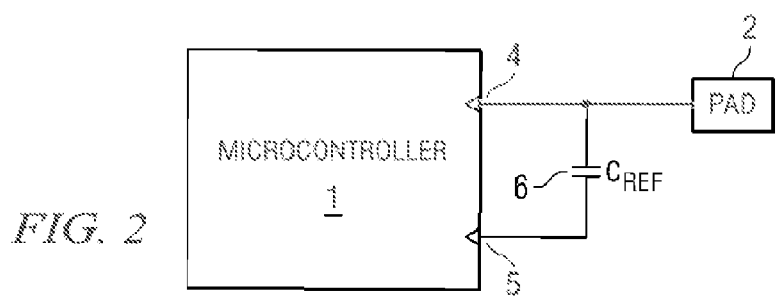
FIG. 2 illustrates another embodiment of a single-pad sensor configuration using a reference capacitor in an open or untouched state.

FIG. 2 shows an embodiment whereby the impedance circuit 3 is implemented as a reference capacitor 6. Other embodiments of the impedance circuit 3 may make use of other passive elements needed for a specific application. The pad 2 appears to the microcontroller as a unitary element. The pad 2 is operated by a finger, stylus, or presence of a body, which alters characteristics of the circuit as will be explained in more detail below.

Figure 3:
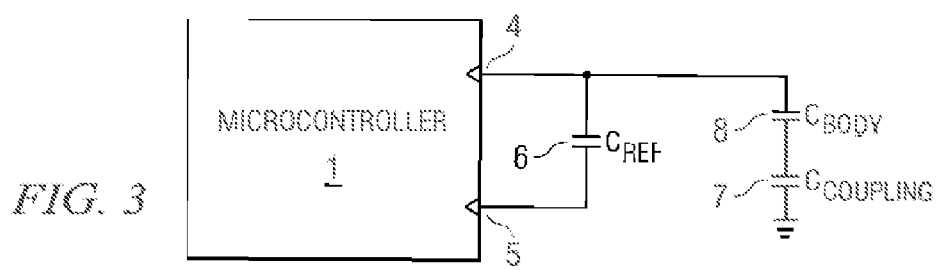
FIG. 3 illustrates an equivalent circuit diagram of an embodiment of a single-pad sensor configuration when touched or activated.

FIG. 3 shows the equivalent circuit of an embodiment where the pad 2 has been operated, such as being touched by a user. After being operated, the net capacitance value of the combination will change. The capacitance of the body operating the pad is represented by $C_{BODY}$ 8. The object has a coupling path to the circuit ground through an equivalent capacitance $C_{COUPLING}$ 7. Capacitance $C_{COUPLING}$ 7 is in series with the body capacitance $C_{BODY}$ 8. The combination of $C_{BODY}$ 8 and its coupling capacitance to ground $C_{COUPLING}$ 7 represent the new capacitance of the pad 2, when the pad 2 is operated.

Figure 4:
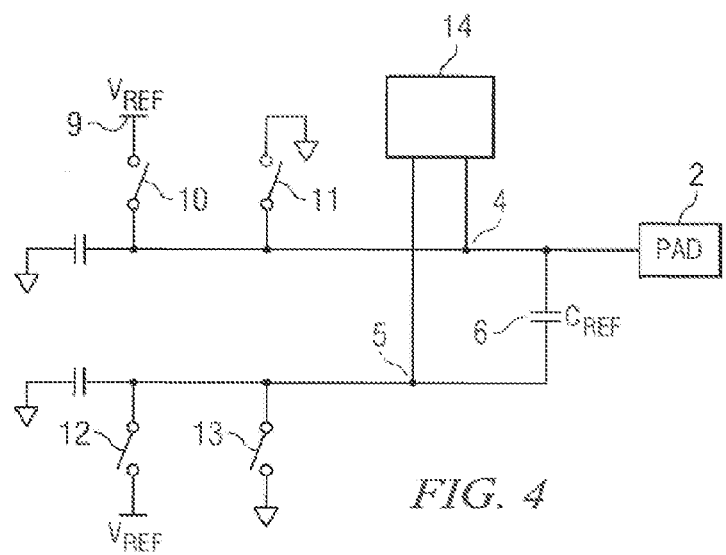
FIG. 4 illustrates an embodiment of a circuit configuration using switches to apply reference voltages or ground to pins.

FIG. 4 shows an embodiment with a single pad configuration using switches to apply reference voltages 9 and ground to pins 4, 5, and units operable to measure voltage 8. According to an embodiment, the reference voltage 9 is a pull-up direct current voltage source. The reference voltage 9 may have a value, of, for example, five volts or 3.3 volts. One embodiment of the reference voltage uses a voltage provided externally to the unit. The reference voltage may be embodied by any voltage useful to operate the pad in sensing touch. One embodiment utilizes a first switch 10 to connect a reference voltage 9 to a pin 4, and uses a second switch 11 to ground the pin 4. Likewise, another first switch 12 and another second switch 13 may be used to connect a reference voltage or ground to a different pin 5. The switches 10, 11, 12, 13 may be operable through a circuit or may be operable through firmware.

A unit 14 operable to measure or compare a voltage is connected to the first pin 4 and the second pin 5. Other embodiments of unit 14 to measure a voltage across pins 4, 5 may have separate units to measure or compare the voltage of each individual pin. Other embodiments of the unit 14 operable to measure or compare a voltage may be connected to ground or to a baseline voltage. One embodiment of unit 14 operable to measure or compare a voltage uses the internal configurable circuitry of a microcontroller. The particular mechanism to measure or compare a voltage may be enabled or disabled dynamically according to the configuration of the chip. Embodiments of unit 14 operable to measure or compare a voltage may be an analog-to-digital converter (ADC), an integrator circuit to make this measurement, or a comparator to make a comparison between the resulting voltage and a baseline voltage without determining the actual value of the resulting voltage. Another embodiment compares a voltage reading to prior resulting voltages to determine whether the capacitance of the pad 2 has changed.

Figure 5:
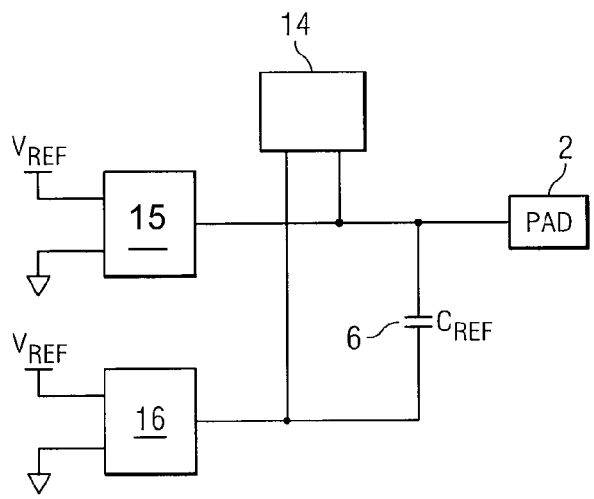
FIG. 5 illustrates another embodiment of a single-pad sensor configuration.

FIG. 5 shows an embodiment of a single pad configuration using units 16, 16' capable of applying a reference voltage 9 or ground to a pin 4, 5. These units may be embodied by the switch configuration described in FIG. 4. Other embodiments may use a different switch mechanism to apply the reference voltage 9 or ground the pin, such as a selector or multiplexer. The units 16, 16' may be configured and operable through firmware of a microcontroller. Other embodiments may combine units 16 and 16' to form a unit capable of applying reference voltage 9 or ground to any number of pins.

Units 16, 16' to apply reference voltages and apply ground to pins and units 14 to measure the voltage across pins may be combined in the embodiments of a microntroller 1, or as separate circuits or units working in conjunction with embodiments of a microcontroller.

Another embodiment of a unit capable of applying a reference voltage 9 to a ground to a pin 4,5 uses applying an analog voltage output to the pin 4,5, instead varying the voltage applied to the pin from the reference voltage value to ground.

Figure 6:
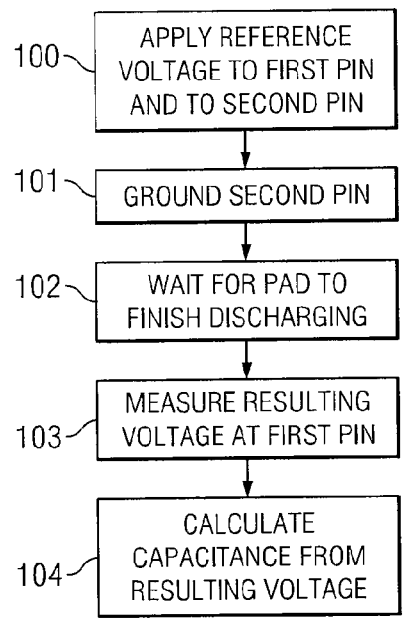
FIG. 6 illustrates an embodiment of a method of determining capacitance in a single-ended mode in a single pad configuration.

FIG. 6 demonstrates the method for operating the invention in a single pad configuration. First in step 100, a reference voltage 9 is applied to both the first pin 4 and the second pin 5. The net resulting voltage across the impedance unit 3 is thus 0 volts, and the resulting voltage on the pad 2 is the applied reference voltage 9.

In the second step 101, the reference voltage is removed from both the first pin and the second pin 5 is grounded. This action causes a circuit to be created with the pad and the impedance unit 3 in series, as shown in FIG. 3. Charge accumulated on the pad 2 will be discharged. The impedance unit 3 previously had no charge, but will acquire charge from the pad 2. The third step 102 is to wait for a steady-state to be reached and the charge on the pad 2 and the impedance unit 3 are relatively stable.

The fourth step 103 is to measure or compare the resulting voltage across the impedance unit 3 and pad 2. In one embodiment, the first pin 4 can be configured programmatically as an analog input. The analog input can also act in single-ended mode, whereby the voltage is the potential difference between the first pin 4 and ground.

In one embodiment, once the voltage has been determined, the capacitance of the pad 2 may be calculated 104. In one embodiment, the voltage at the first pin can be compared to another voltage without explicit calculation of capacitance. After the third step 102, the current in the equivalent circuit is equal to the capacitance of each component times the change in voltage over time (I=C*dV/dt). The current is the same through both the impedance unit 3 and the pad 2, so the capacitance of the impedance unit 3 times the change in voltage of the impendence unit 3 over time is equal to the capacitance of the pad 2 times the change in voltage of pad 2 over time:

$$I = C_{REF} * dV_{CREF}/dt = C_{Pad} * dV_{Pad}/dt \quad \text{(equation 1)}$$

With the result that $$C_{REF} * dV_{CREF} = C_{Pad} * dV_{Pad}. \quad \text{(equation 2)}$$

Analyzing the equivalent circuit with Kirchoff's Voltage Rule, the sum of the voltages of the impedance unit 3 and the pad 2 must be zero. The voltage across the pad 2 was originally a quantity equal to the reference voltage, and then reduced by a quantity $dV_{Pad}$. The voltage across the impedance unit 3 was zero, but then acquired a quantity $dV_{CREF}$. Thus, $$dV_{CREF} = V_{REF} - dV_{Pad} \quad \text{(equation 3)}$$

Combining equations 2 and 3, the capacitance of the pad 2 can be expressed by:

$$C_{Pad} = (C_{REF} * dV_{CREF})/(V_{REF} - dV_{CREF}) \quad \text{(equation 4)}$$

where $C_{REF}$ is the known capacitance of the impedance unit 3, $V_{REF}$ is the reference voltage applied to the pin 4, and $dV_{CREF}$ is the voltage measured across the impedance unit 3, or alternatively, at the first pin 4.

In one embodiment, the calculation of capacitance 104 is done by comparison of resulting voltage to a baseline voltage, another resulting voltage, or a set value. By determining the capacitance, it can be determined whether a change in capacitance has occurred. This capacitance, or change in capacitance, signals that the pad has been touched by an object, or that the pad acting as a proximity sensor has been approached by an object.

The invention may take further steps depending upon the value of the resulting voltage or capacitance. It may act to turn on a button, activate a control, move a slider, trigger an alarm, communicate data or alerts to another system, or any other activity enabled by a touch and proximity sensor.

Figure 7:
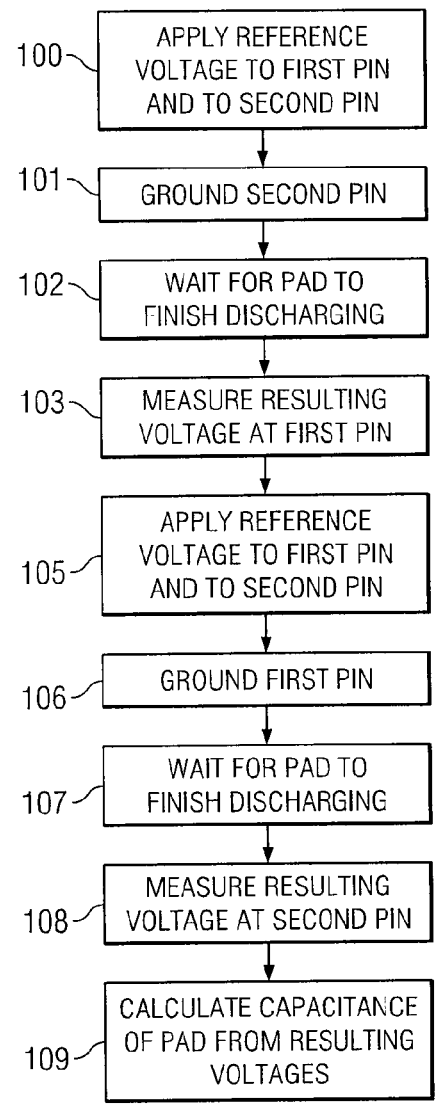
FIG. 7 illustrates an embodiment of a method of determining capacitance in differential mode in a single pad configuration.

FIG. 7 illustrates another embodiment of determining resulting voltage and calculating capacitance in differential mode. First, steps 100, 101, 102, and 103 are conducted, producing a first resulting voltage at the first pin 4. Then in step 105 a reference voltage 9 is applied across the second pin 5 and the first pin 4. The reference voltage 9 is removed and the first pin 4 is grounded 106. After a steady-state is reached 107, the next step 108 is to measure the voltage of the second pin 5. Alternatively, the voltage at the second pin 5 may be directly compared to the first resulting voltage. The resulting capacitance of the first pin may be found 109 according to equation 4 or by comparison to the voltage at the second pin 5.

Figure 8:
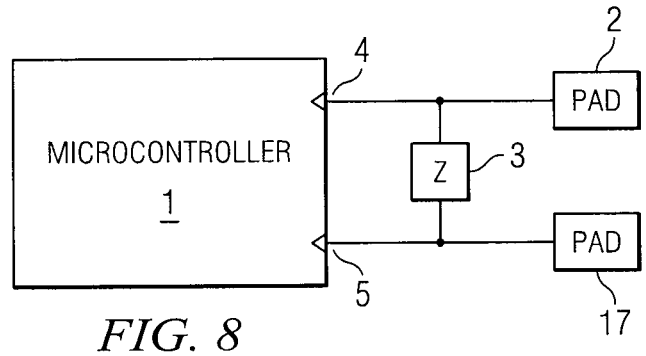
FIG. 8 illustrates an embodiment of a dual-pad configuration using a microcontroller.

FIG. 8 illustrates another embodiment wherein a second pad 17 is connected to second pin 5, in addition to first pad 2 connected to first pin 4. Second pad 15 may be used as a touch sensor or proximity sensor with the existing system without any additional components. The various embodiments discussed above are fully applicable to the present embodiment.

Figure 10:
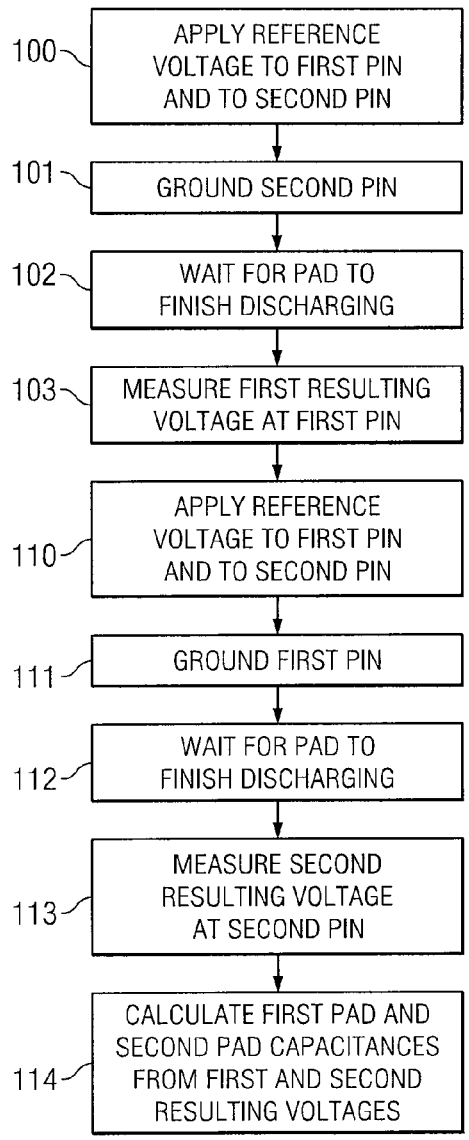
FIG. 10 illustrates an embodiment of a method for determining capacitance in a dual pad configuration.

FIG. 10 illustrates that to determine the capacitance of the second pad 17 or its equivalent resulting voltage, the steps of FIG. 6 or FIG. 7 are repeated, but with the roles of the first pin 4 and second pin 5 reversed.

First, steps 100, 101, 102, and 103 are executed to obtain the resulting voltage from the first pad 2. Then in step 110 a reference voltage is applied across the second pin 5 and the first pin 4. The impedance unit 3 has no potential, and the second pad 17 has the potential of the reference voltage. The reference voltage is removed and first pin 4 is grounded 111. The result is that impedance unit 3 and second pad 17 are in series together in a closed circuit, the second pad 17 discharges and the impedance unit 3 collects the charge. After a steady-state is reached 112, the voltage of the second pad 17 may be measured or compared 113 and the resulting capacitances of the first pad 2 and second pad 15 may be calculated 114 using equation 4. In one embodiment, calculation of the capacitances of the first pad 2 and the second pad 17 may happen at different times. In one embodiment, steps 100, 101, 102, and 103 may be performed after steps 110, 111, 112 and 113 are performed. In one embodiment, the set of steps 100, 101, 102 and 103 or the set of steps 110, 111, 112 and 113 may be skipped to measure the capacitance of a single pad.

Figure 11:
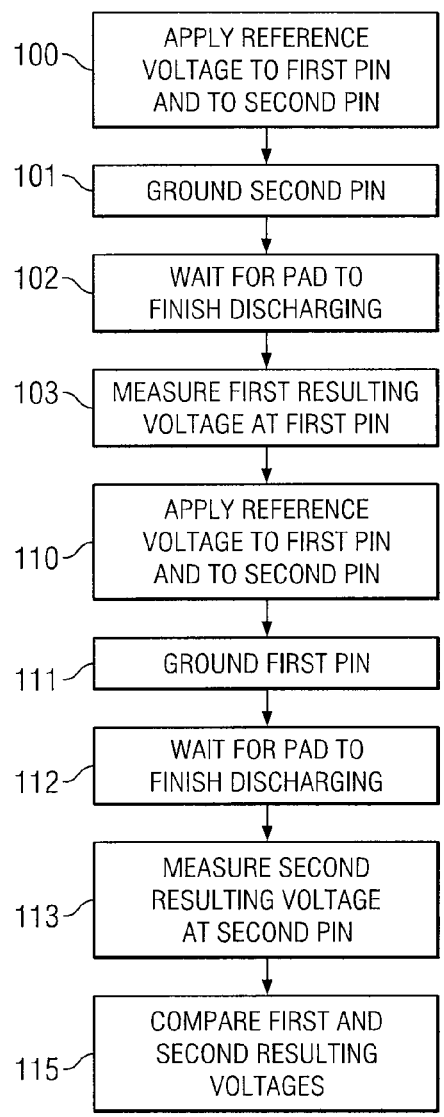
FIG. 11 illustrates an embodiment of a method for determining capacitance in a dual pad configuration using differential mode.

FIG. 11 illustrates an embodiment wherein the capacitance of a dual-pad configuration is determined in differential mode. With resulting voltages measurements from two pads, the voltages can be compared to each other to determine relative capacitance 115. In one embodiment, this is used to implement a toggle switch.

Figure 9:
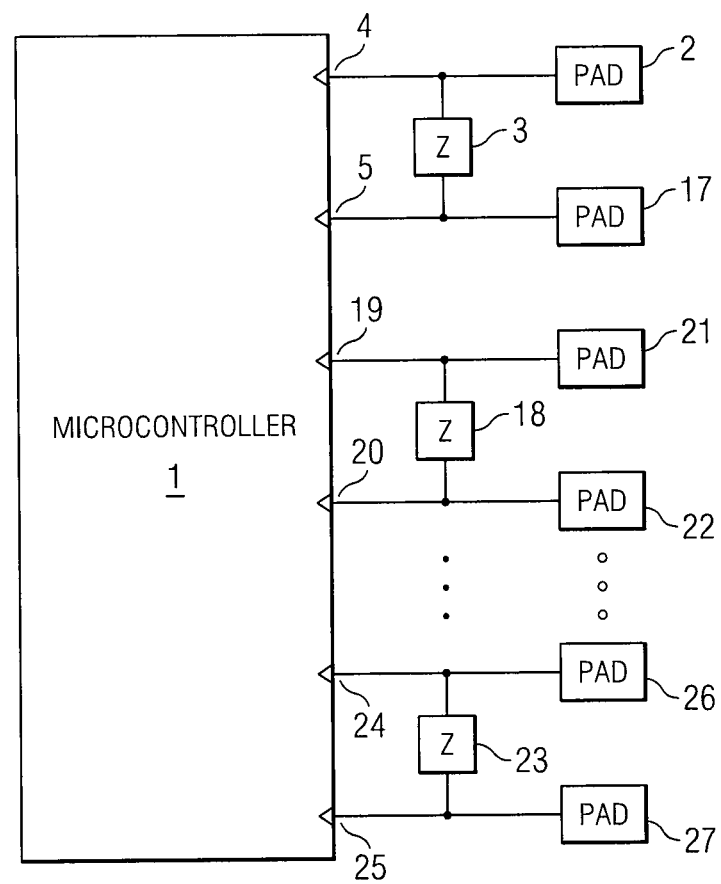
FIG. 9 illustrates an embodiment of an N-pad configuration using a microcontroller.

FIG. 9 illustrates an embodiment where a series of single or dual-pad configurations are combined to produce a sensor array. The embodiment may contain multiples of a set comprising an impedance unit 23 connected between a first pin 24 and a second pin 25, a first pad 26 connected to the first pin 24 and an optional second pad 27 connected to the second pin 25. Each pad may be operated in the methods previously described. In one embodiment, each set may be connected to a microcontroller 1. In one embodiment, each set is connected via its first pin 24 and second pin 25 to a unit operable to apply voltages and ground 16, or 16' and to a unit operable to measure or compare voltage 14.

In one embodiment, units operable to apply voltages and ground 16, or 16', and/or units operable to measure or compare voltage 14 are configurable in a microcontroller 1. The internal circuitry of the microcontroller can enable instances of these units at different times during the operation of the invention. In one embodiment, this is accomplished through switches.

What is claimed is:
1. A system for measuring capacitance, comprising:
   a microcontroller comprising a measurement circuit and a plurality of external pins;
   a reference capacitor coupled to a first pin and to a second pin of the microcontroller;

the first pin connected to a first switching unit of the microcontroller configured to apply or remove a reference voltage or ground to said first pin;

the second pin connected to a second switching unit of the microcontroller configured to apply or remove a reference voltage or ground to said second pin;

a pad connected to the first pin wherein the second pin is connected to the reference capacitor; and an analog to digital converter in said microcontroller operable to measure a voltage between the first pin and second pin, wherein the microcontroller is configured to control the first and second switching units to apply in a first state the reference voltage simultaneously to said first and said second pin from which state the reference voltage is removed from the first pin, and the second pin is switched from the reference voltage to ground and after a predetermined settling time, said analog to digital converter is controlled to measure a first voltage between the first pin and the second pin, and thereafter to control the first and second switching units to apply in a second state the reference voltage simultaneously to said first and said second pin from which state said reference voltage is removed from said second pin and first pin is switched from the reference voltage to ground and after a predetermined settling time, said analog to digital converter is controlled to measure a second voltage between the first pin and the second pin.

2. The system of claim 1, wherein the first and second switching units operable for applying reference voltages and ground to the first and second pins, respectively, each comprising:
a first switch connected to one of the first and second pins and to the reference voltage; and
a second switch connected to the one of the first or second pins and to ground.

3. The system of claim 1, wherein the microcontroller comprises firmware to control the first and second switching unit.

4. The system of claim 1, wherein the system forms a proximity sensor.

5. The system of claim 1, wherein the microcontroller is further configured to determine a capacitance of the pad from said first and second voltage.

6. The system of claim 5, further comprising:
a plurality of first and second pin pairs, a plurality of pads connected with each first pin, a plurality of reference capacitors connected with each first and second pin, and a plurality of first and second switching units operable to apply a reference voltage or ground to each pin of said first and second pin pairs;
each said reference capacitor connected to one of said first and second pin pairs;
each said first and second pin pairs connected to a respective one of said first and second switching units;
each said pad connected to a respective first pin.

7. The system of claim 1, wherein the first and second switching units operable for applying reference voltages and ground to said first and second pins can be enabled through configuration of the microcontroller.

8. The system of claim 7, wherein the analog to digital converter operable for measuring voltage between the first pin and second pin can be enabled through configuration of said chip.

9. A method of measuring capacitance of a pad comprising:
coupling the pad and a first terminal of a reference capacitor to a first I/O port of a microcontroller;
coupling a second I/O port of the microcontroller to a second terminal of the reference capacitor;
simultaneously applying a voltage to the pad and to both terminals of the reference capacitor and thereafter removing the voltage from the first terminal and the pad and switching the second terminal of the reference capacitor from the voltage to ground,
after a predetermined settling time, measuring a resulting first voltage across the reference capacitor,
thereafter simultaneously applying the voltage to the pad and to both terminals of the reference capacitor and thereafter removing the voltage from the second terminal and switching the first terminal of the reference capacitor and the pad from the voltage to ground,
after a predetermined settling time, measuring a resulting second voltage across the reference capacitor, and
determining a capacitance value of said pad from the measured first and measured second voltages.

10. The method of claim 9, wherein the action of applying voltage across said pad is automated by the microcontroller through firmware.

11. The method of claim 9, wherein the action of applying voltage across said reference capacitor is automated by a microcontroller.

12. The method of claim 9, wherein the action of grounding said reference capacitor is automated by a microcontroller through firmware.

13. The method of claim 9, wherein the second voltage is compared with the first voltage.

14. The method of claim 9 applied to the measurement of capacitance of a plurality of pads.

15. A method of calculating the capacitance of two pads connected across a reference capacitor, comprising:
coupling a first pad and a first terminal of a reference capacitor to a first I/O port of a microcontroller;
coupling a second pad and a second terminal of the reference capacitor to a second I/O port of the microcontroller;
performing steps in the following order:
applying a reference voltage to the first I/O port and the second I/O port in a first state;
directly from said first state, grounding one terminal of said reference capacitor not connected to the first pad while removing the reference voltage from the respective other terminal to create a circuit comprising said reference capacitor coupled in series with said first pad; and
measuring a first resulting voltage across said reference capacitor, said first resulting voltage corresponding to the capacitance value of said first pad;
and thereafter the method further comprises steps in the following order:
applying the reference voltage to the first I/O port and the second I/O port;
grounding one terminal of said reference capacitor not connected to the second pad while removing the reference voltage from the respective other terminal to create a circuit comprising said reference capacitor coupled in series with said second pad; and
measuring a second resulting voltage across said reference capacitor, said second resulting voltage corresponding to the capacitance value of said second pad.

16. A system for measuring capacitance, comprising:
a reference capacitor connected to a first node and to a second node, wherein first and second nodes are external I/O pins of a microcontroller;

each said node connected to a first and second switching unit of the microcontroller operable to apply or remove a reference voltage or ground to one of said nodes;

a first pad connected to the first node;

a second pad connected to the second node; and an analog to digital converter of the microcontroller operable to measure a voltage between the first node and second node, wherein for measuring a capacitance of the first and second pad, the first and second switching units are controlled to apply the reference voltage simultaneously to said first and said second node in a first state and directly from said first state to remove the reference voltage from said first node and to apply ground to said second node and after a predetermined settling time, to control said analog to digital converter to measure a first voltage at the first node, and thereafter said first and second switching units are controlled to apply the reference voltage to said first and said second node and subsequently to remove the reference voltage from said second node and to apply ground to said first node and after a predetermined settling time, to control said analog to digital converter to measure a second voltage at the second node, wherein the microcontroller determines the capacitance of the first pad from said first voltage and the capacitance of the second pad form said second voltage.

17. The system of claim 16, wherein the first and second switching units operable for applying reference voltages and ground to the nodes each comprising:

a first switch connected to the node and to the reference voltage; and a second switch connected to the node and to ground.

18. The system of claim 16, further comprising:

a plurality of first and second node pairs, a plurality of first pads, a plurality of second pads, a plurality of reference impedances, and a plurality of first and second switching units operable to apply a reference voltage or ground to each node of said first and second node pairs;

each said reference impedance is connected to one of said first and second node pairs;

each said first and second node pairs are connected to a respective one of said first units;

each said first pad connected to a respective first node; and each said second pad connected to a respective second node.

* * * * *